United States Patent [19]

Masel et al.

[11] 4,384,275
[45] May 17, 1983

[54] HIGH RESOLUTION AND WIDE RANGE SHAFT POSITION TRANSDUCER SYSTEMS

[75] Inventors: Marvin Masel, Teaneck; Ralph J. Meehan, Wayne; Joris Schroeder, Chatham, all of N.J.

[73] Assignee: Otis Elevator Company, Farmington, Conn.

[21] Appl. No.: 228,868

[22] Filed: Jan. 27, 1981

Related U.S. Application Data

[63] Continuation of Ser. No. 927,242, Jul. 21, 1978, abandoned, and a continuation of Ser. No. 641,798, Dec. 18, 1975, abandoned.

[51] Int. Cl.³ .................. H03K 13/02; G01D 5/34
[52] U.S. Cl. .................. 340/347 P; 250/231 SE; 340/347 M
[58] Field of Search .................. 340/347 M, 347 P; 250/231 SE

[56] References Cited

U.S. PATENT DOCUMENTS

| | | | |
|---|---|---|---|
| 2,666,912 | 1/1954 | Gow et al. | 340/347 P X |
| 2,775,755 | 12/1956 | Sink | 340/206 X |
| 2,779,539 | 1/1957 | Darlington | 340/347 P X |
| 2,900,629 | 8/1959 | Daniels | 340/347 P |
| 2,901,170 | 8/1959 | Poole | 340/347 P X |
| 2,993,200 | 7/1961 | Walker et al. | 340/347 P |
| 3,096,444 | 7/1963 | Seward | 340/347 P X |
| 4,041,483 | 8/1977 | Groff | 250/231 SE X |

Primary Examiner—T. J. Sloyan
Attorney, Agent, or Firm—Robert E. Greenstien

[57] ABSTRACT

Apparatus for producing digital signals signifying the angular position in each revolution and the number of revolutions of a shaft which rotates a plurality of times. The apparatus includes two rotary position transducers which are coupled to each other and to the shaft. Both of these transducers rotate a plurality of times in response to the rotations of the shaft, one of the transducers rotating at a different speed than the other. Each transducer produces signals which are individual to the respective transducer and are the same for each rotation of the respective transducer.

5 Claims, 9 Drawing Figures

HIGH RESOLUTION AND WIDE RANGE SHAFT POSITION TRANSDUCER SYSTEMS

CROSS-REFERENCE TO RELATED APPLICATIONS

This application is a continuation of copending application Ser. No. 927,242, which was filed on July 21, 1978, is now abandoned, and was a continuation of abandoned application Ser. No. 641,798, which was filed on Dec. 18, 1975 abandoned.

This invention relates to apparatus for generating signals signifying the angular position of a shaft which rotates a plurality of times.

In the past when it has been desired to produce a signal indicative of the angular position of a shaft which rotates a plurality of times, it has been standard practice where high resolution and wide range are to be obtained to employ a gear reduction unit with two rotary position transducers. One transducer is driven directly from the shaft to give accurate resolution signals. The other transducer is driven from the gear reduction unit and produces the range signals. Early arrangements of this type required extremely accurate and costly gear reduction units.

An arrangement for reducing the complexity of a gear reduction unit for use with two rotary position transducers is taught in U.S. Pat. No. 2,944,159. This simplified gear arrangement is employed in U.S. Pat. No. 3,885,209 in combination with two synchros or resolvers which are electrically coupled to cascade to provide analog position signals. When synchros or resolvers of the type employed in this latter patent are employed and a digital output signal signifying the position of a shaft is desired, analog to digital conversion equipment is required. Conversion to digital signals is difficult where both high resolution and wide range are provided by the analog equipment and consequently, such apparatus is expensive.

It is an object of this invention to provide apparatus which produces digital signals signifying the angular position of a shaft and is simpler than previous apparatus.

One of the features of the invention is the employment of two rotary position transducers, both of which rotate a plurality of times and produce signals which are ambiguous, in that the same signals are generated for each revolution of the respective transducer.

In carrying out the invention, apparatus is provided which generates signals signifying the angular position of a first shaft. This shaft has a first reference point and rotates a first plurality of times. The apparatus includes a second shaft which rotates at a speed different than the speed of rotation of the first shaft. This second shaft has a second reference point and rotates through a second plurality of rotations in response to the first shaft rotating through the first plurality of rotations. A first rotational means is rotated by the first shaft and generates the same first signals during each rotation of that shaft. These first signals signify the angular position of said first reference point during each rotation of the first shaft. A second rotational means is rotated by the second shaft and generates the same second signals during each rotation of that shaft. These second signals signify the angular position of the second reference point during each rotation of the second shaft. The apparatus also includes logic circuitry which receives the signals generated by the first and second rotational means. In response to these signals, the logic circuitry is operable to produce rotary position signals signifying both the angular position of the first reference point and the number of rotations of the first shaft.

Three separate embodiments of the invention are described. In the first disclosed, the first and second rotational means are absolute encoding devices. Consequently upon the restoration of power after a loss thereof each immediately produces its respective output signal whereupon the logic circuitry immediately produces the rotary position signal signifying both the correct angular position of the first reference point and the correct number of rotations of the first shaft.

In the second and third disclosed embodiments, incremental signal producing devices are employed as the first and second rotational means. Both of the embodiments are arranged however to overcome a shortcoming of previous position transducers employing incremental devices. Upon the restoration of power following a loss thereof previous incremental type transducers required the return to an initial condition or reliance upon an external reference in order to reproduce the correct angular position of the first reference point and the correct number of rotations of the first shaft.

The arrangements of the second and third embodiments disclosed herein have the advantage of not requiring either of the restoratives needed by previous incremental type transducers. As a result, they combine the simplicity of incremental devices with the advantage of absolute devices in this regard. In the second embodiment restoration of the correct angular position of the first reference point and the correct number of rotations of the first shaft is accomplished within two revolutions of the first shaft after the return of power following a power loss. In the third embodiment such restoration is accomplished within one such revolution. From these embodiments, those skilled in the art will also understand how more rapid restoratives can be accomplished by obvious modifications of the embodiments.

Other objects, features and advantages of the invention will be apparent from the following description and appended claims when considered in conjunction with the accompanying drawing in which:

Figure 2:
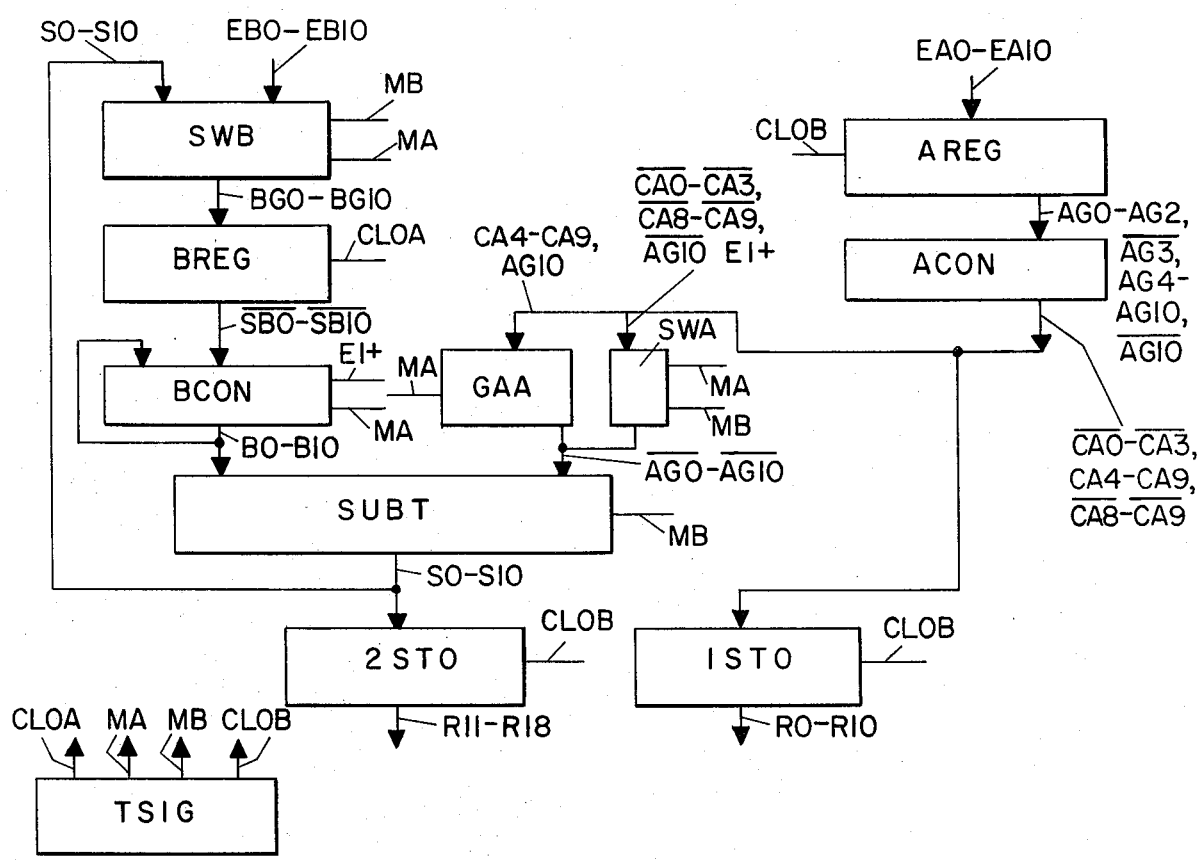
FIG. 2 is a block diagram of one embodiment of the invention.
Figure 3:
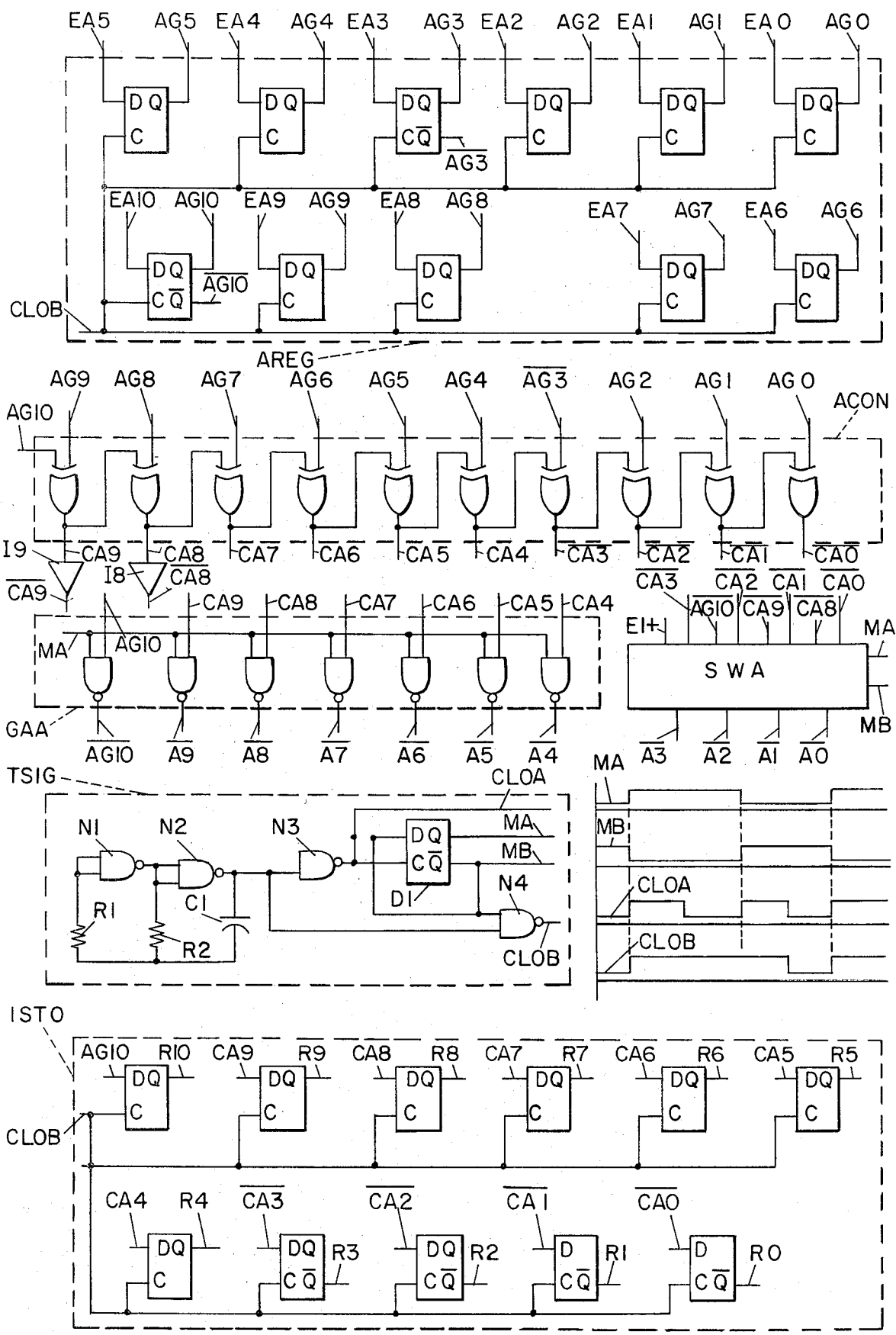
Figure 4:
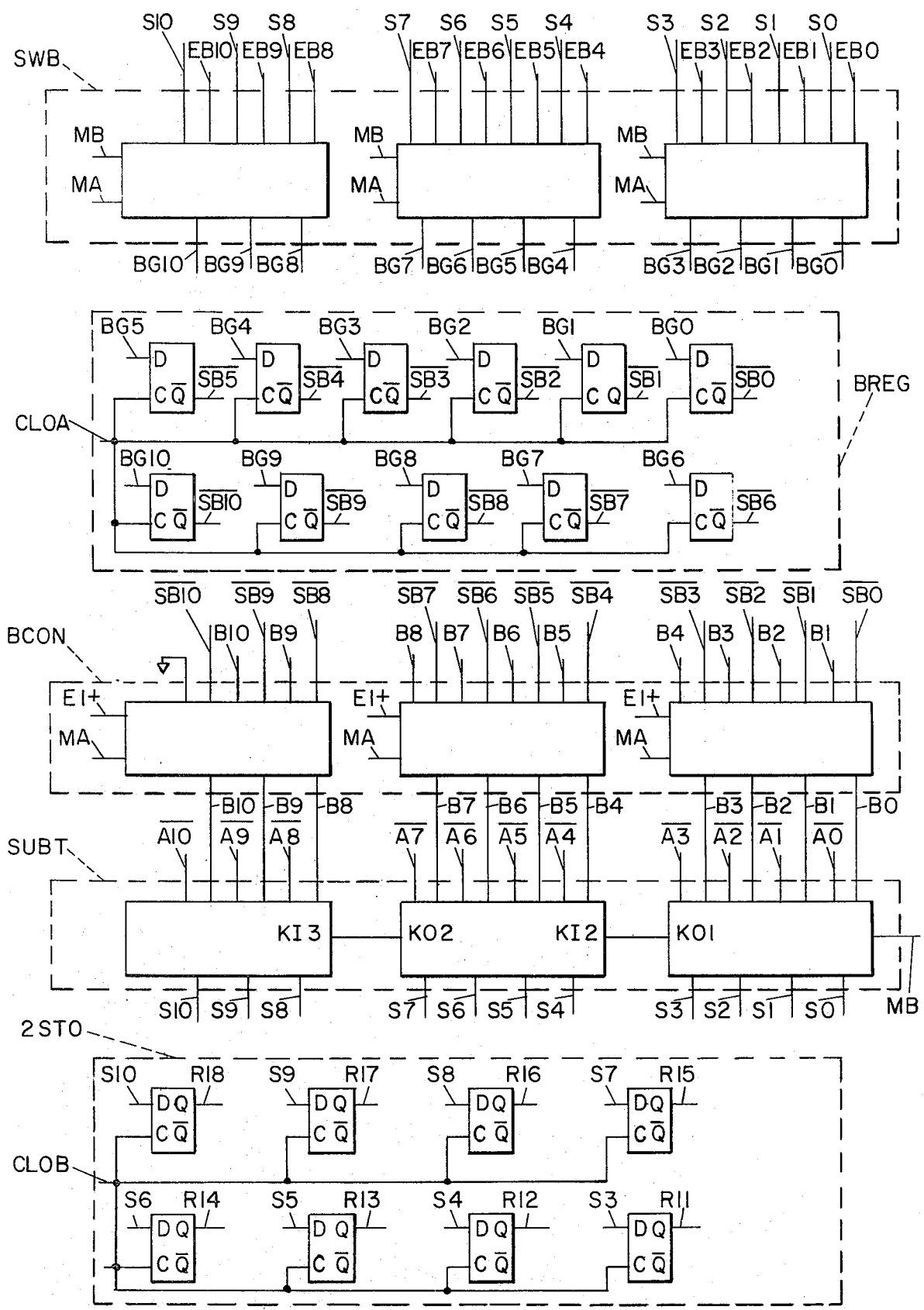
Figure 5:
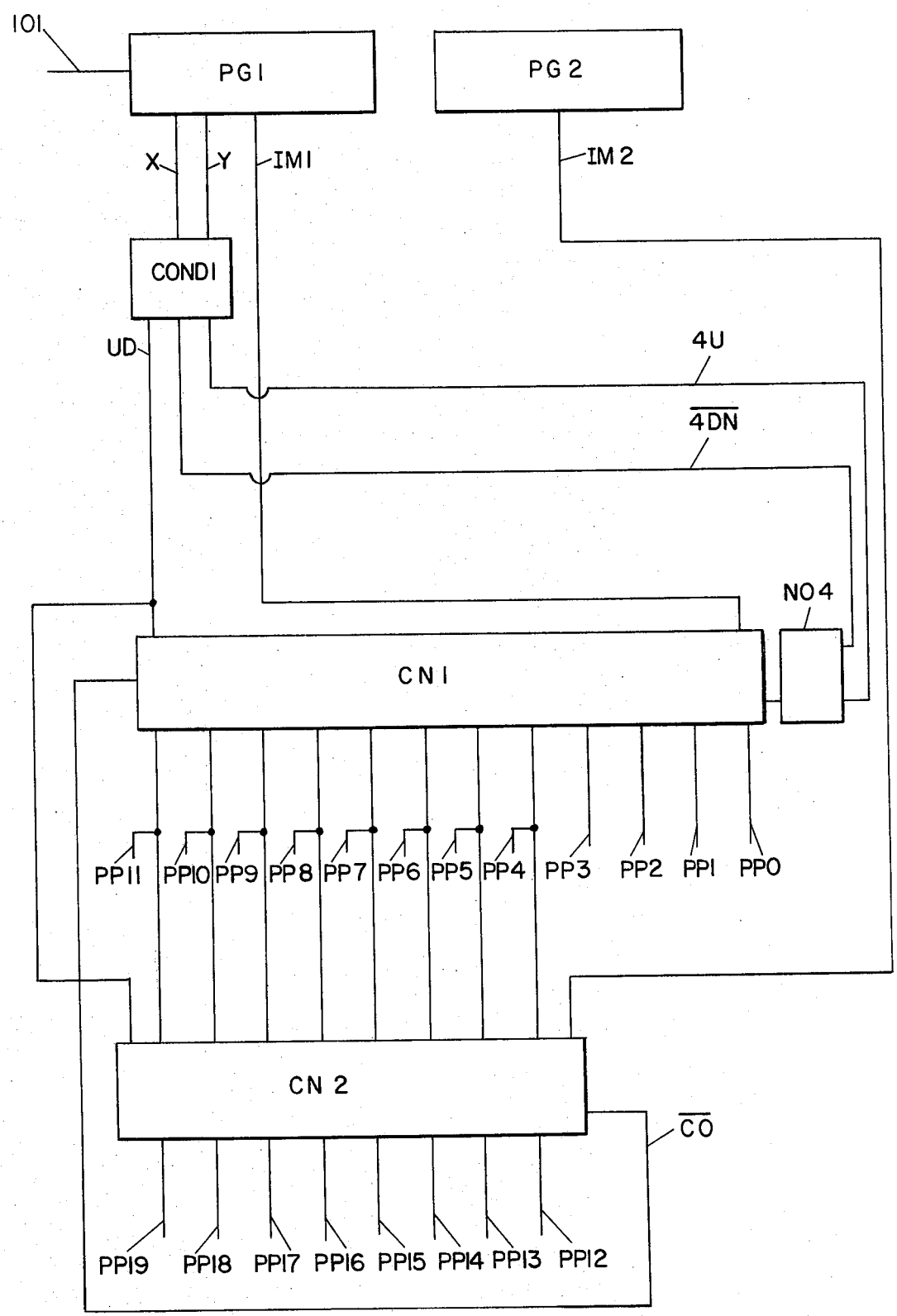
Figure 6:
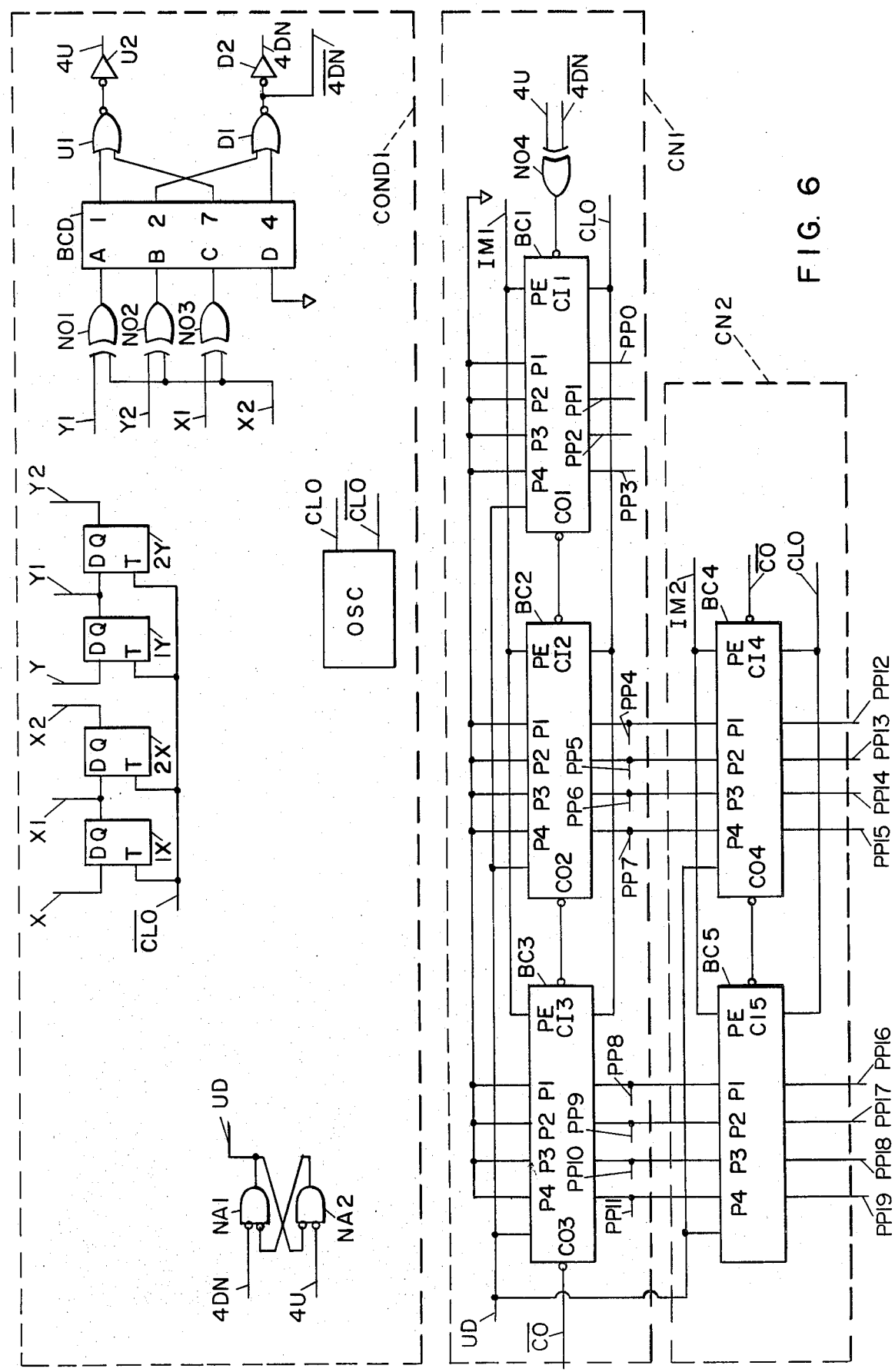
Figure 7:
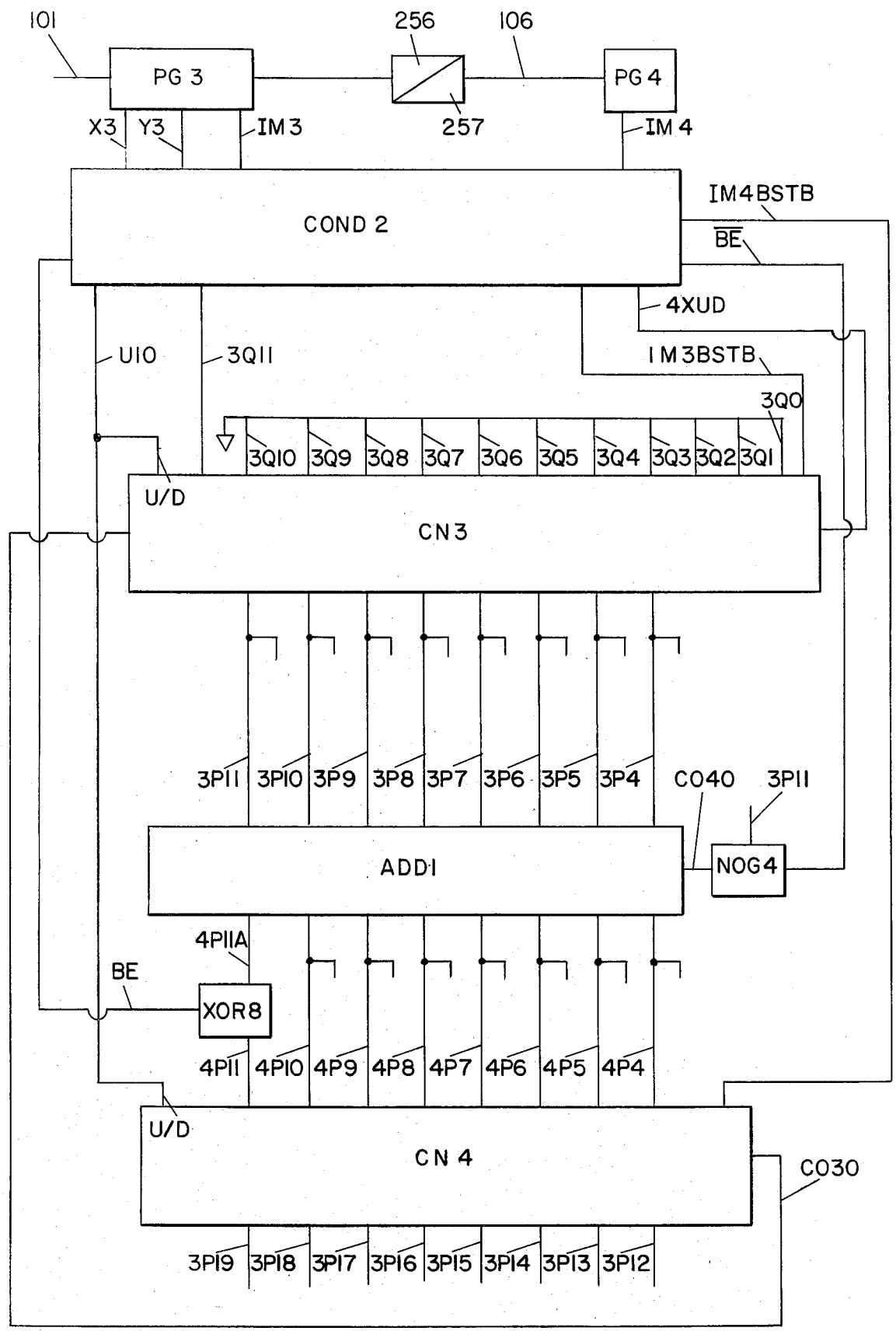

FIGS. 3 and 4 taken together show the circuit elements employed in the embodiment shown in FIG. 2;

FIG. 5 is a block diagram of another embodiment of the invention;

FIG. 6 shows an arrangement of the circuit elements employed in the embodiment shown in FIG. 5;

FIG. 7 is a block diagram of a third embodiment of the invention; and

Figure 8A:
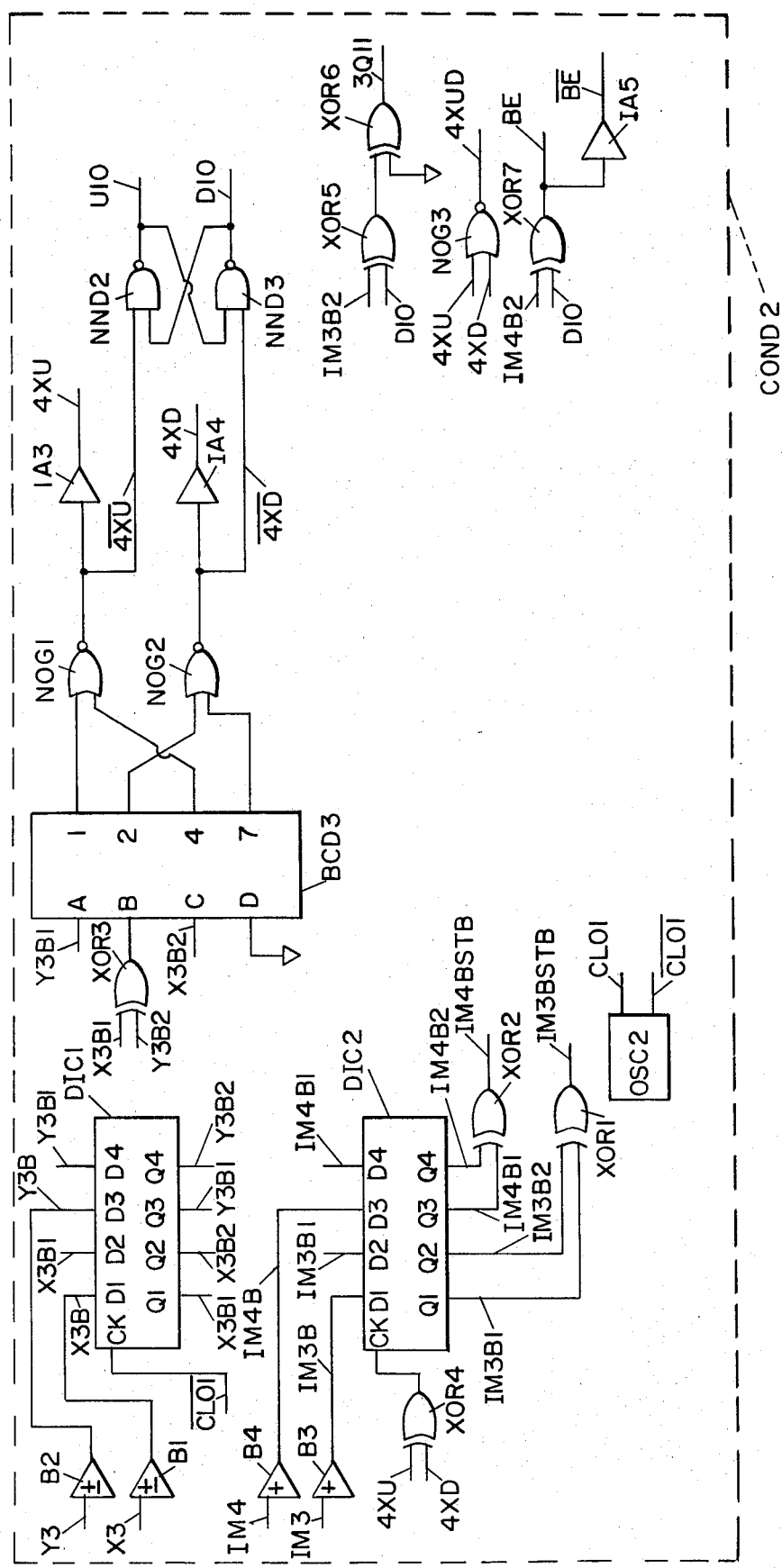
Figure 8B:
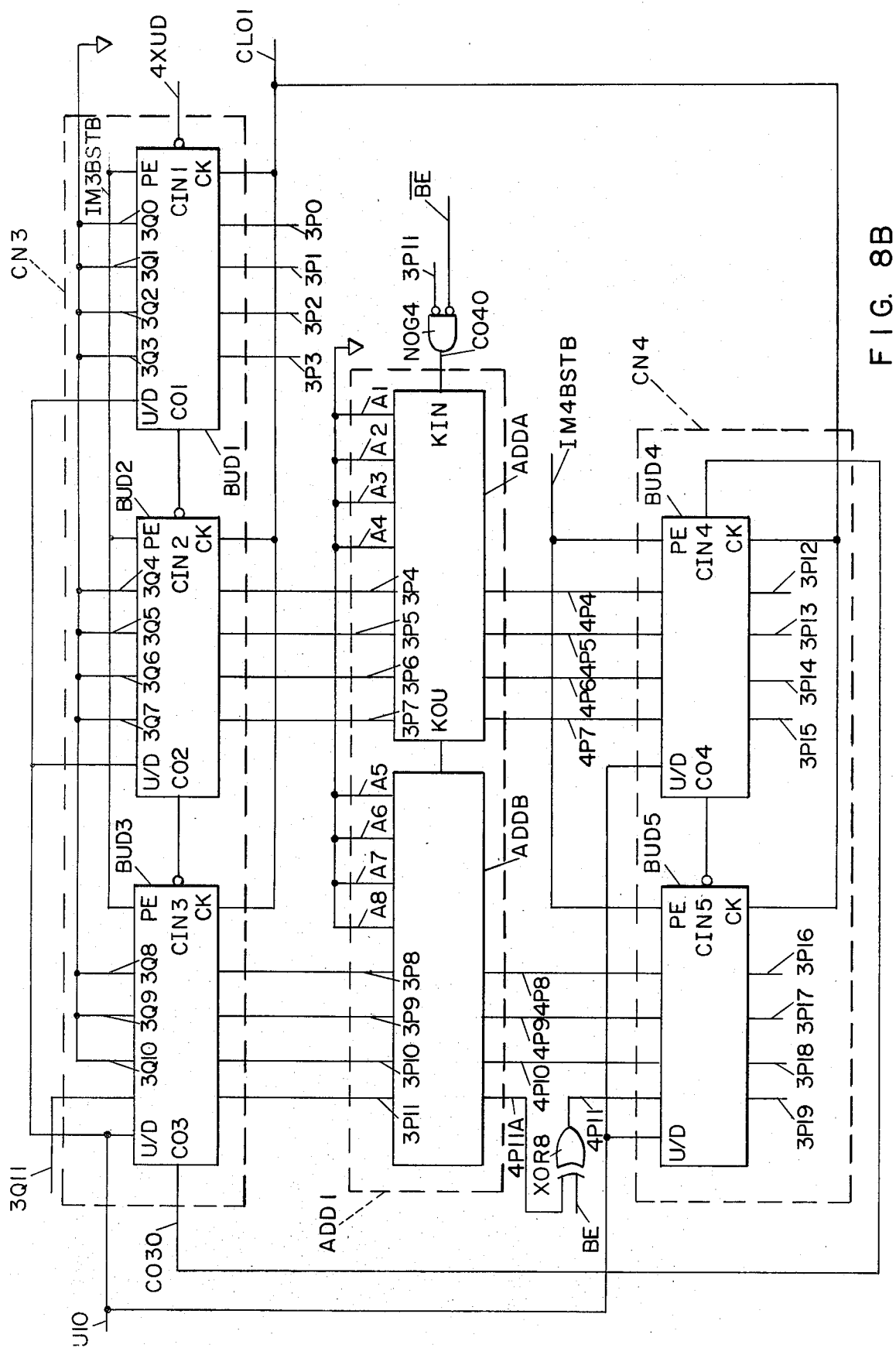

FIGS. 8A and 8B show an arrangement of the circuit elements employed in the embodiment shown in FIG. 7.

Figure 1:
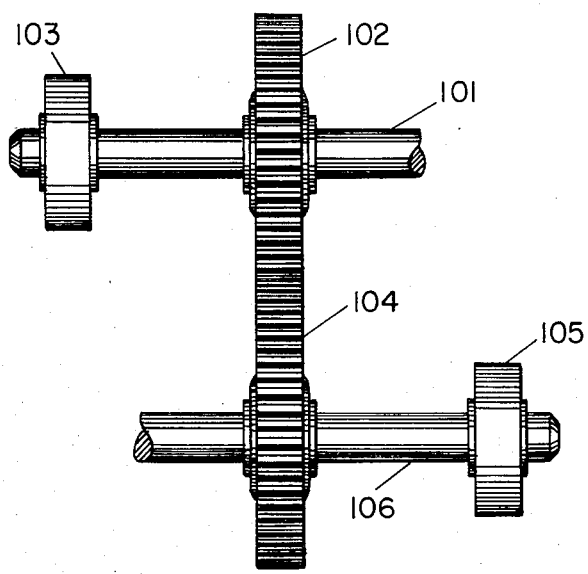
FIG. 1 is a generalized configuration of some of the mechanical elements of the invention.

Referring now to the drawing, shown in FIG. 1 is input shaft 101 upon which is journaled first gear 102 and rotary position transducer 103. Intermeshing with gear 102 is another gear 104 which together with second rotary position transducer 105 is journaled on shaft 106. In all embodiments, gears 102 and 104 comprise the coupling means.

In the first of the three embodiments to be hereinafter described, transducers 103 and 105 are digital encoding devices, each of which for each rotation of its associated transducer produces 2,048 separate output signals, each comprising 11 signal bits. In this first embodiment first gear 102 has one less tooth than second gear 104. In particular in the arrangement described, gear 102 has 255 teeth and gear 104 has 256 teeth.

In the second two embodiments to be hereinafter described, transducers 103 and 105 are each a rotary signal generator. In each of these embodiments first transducer 103 produces 1,024 cycles of an electrical signal in each of two channels during each rotation. In addition, it produces index signals which will be described more fully hereinafter with respect to each embodiment separately. Second transducer 105 in each embodiment produces only index signals to be described hereinafter with respect to each embodiment separately. In these embodiments, first gear 102 has one tooth less than second gear 104 also. In particular in the arrangement described, first gear 102 has 256 teeth and second gear 104 has 257 teeth.

Shown in the block diagram of FIG. 2 is the resolution portion and range portion of apparatus constructed in accordance with the first to be described embodiment of the invention. Reference characters have been shown with respect to various input and output lines on this Figure to show the correspondence between the blocks of this Figure and the circuit elements of FIGS. 3 and 4.

The resolution portion of this apparatus includes a first register AREG which is connected to receive the multiple bit output signal from a first encoder of the Baldwin cyclic encoder series 5V200 variety or the equivalent (mentioned previously as corresponding to transducer 103 but not shown in detail). The encoder selected for this embodiment produces 11-bit gray code output signals along lines EA0-EA10 and consequently the output of register AREG is connected to the input of gray to binary code converter ACON to derive binary coded output signals. The binary coded output signals are applied to gate circuits GAA and selection switch SWA to provide a hereinafter described function. The output signals of converter ACON are also applied to a storage register 1STO.

The range portion of the embodiment shown in FIG. 2 includes selection switch SWB which receives the 11-bit gray code output signals of a second encoder also of the Baldwin cyclic encoder series 5V200 variety or the equivalent (mentioned previously as corresponding to transducer 105 but not shown in detail). These signals are applied along lines EB0-EB10. Switch SWB also receives input signals along lines S0-S10 from a unit described hereinafter. The output of switch SWB is connected to a register BREG whose output in turn is connected to gray to binary code converter BCON.

The outputs of converter BCON, gates GAA and selection switch SWA are fed into subtracter circuit SUBT which produces signals indicative of the number of rotations of shaft 101 (FIG. 1) in this embodiment. These signals are applied to second storage device 2STO and to switch SWB. Also shown in FIG. 2 is timing signal generating device TSIG which produces output pulses along lines CLOA, MA, MB and CLOB.

FIG. 3 shows that register AREG comprises 11 type D flip-flops of the Motorola MC14013 variety or the equivalent. Each of these receives a clock pulse from signal generator TSIG along line CLOB. As is well known when a clock pulse appears along line CLOB each of these flip-flops can produce an output along its respective output line AG0-AG10 in accordance with the input on its respective input line EA0-EA10. Also two of these flip-flops which receive input signals along lines EA3 and EA10 produce second outputs along lines $\overline{AG3}$ and $\overline{AG10}$ which are the inverse of the outputs along lines AG3 and AG10. The inverter output signal $\overline{AG3}$ together with the first output signals along lines AG0-AG2 and AG4-AG10 are applied to ten exclusive OR gates as shown which comprise the gray to binary code converter ACON. These exclusive OR gates are of the Motorola MC14507 variety or the equivalent.

The outputs from converter ACON along lines $\overline{CA0}$-$\overline{CA3}$ are the inverted four least significant bits of each binary coded number corresponding to each gray code number applied to register AREG along lines EA0-EA10. The seven most significant bits of the binary coded numbers corresponding to the gray code numbers applied to register AREG are produced along lines AG10 and CA9 through CA4. The signals on lines CA8 and CA9 are applied to the inputs of inverters I8 and I9 of the Motorola MC14049 or the equivalent which produce output signals along lines $\overline{CA8}$ and $\overline{CA9}$.

Selection switch SWA comprising a 4-bit AND/OR selector circuit of the Motorola MC14519 variety or the equivalent, receives the inverted four least significant bits of each binary number generated along lines $\overline{CA0}$-$\overline{CA3}$ together with the signals appearing along lines $\overline{AG10}$, $\overline{CA9}$, $\overline{CA8}$ and E1+. The signal applied along line E1+ is a constant positive d.c. potential equivalent to the potential representing a binary one in the disclosed apparatus and is derived from any suitable source (not shown). Switch SWA generates output signals along output lines A0-A3 corresponding to the inputs along lines $\overline{CA0}$-$\overline{CA3}$ or along lines E1+, $\overline{AG10}$, $\overline{CA9}$ and $\overline{CA8}$ depending upon whether a pulse is applied to the switch along lines MA or MB, respectively. Gates GAA comprising seven NAND units of the Motorola MC14011 variety or its equivalent receive inputs along lines CA4-CA9 and AG10 and produce signals along output lines A4-A10 when a pulse appears along line MA. The signals along lines $\overline{CA0}$-$\overline{CA3}$, CA4-CA9 and AG10 are also applied to a first storage unit 1STO comprising 11 type D flip-flops of the Motorola MC14013 variety or the equivalent. Upon the reception of a clock pulse along line CLOB each of these flip-flops produces an output signal along lines R0-R10 in accordance with the input signal applied to it.

Timing signal generator TSIG of FIG. 3 includes two NAND gates N1 and N2 of the Motorola MC14011 variety or the equivalent, which together with resistors R1 and R2 and condenser C1 comprise a free-running multivibrator which generates pulses at a frequency of $(2^{22}/100)$ Hz. These pulses are employed by a type D flip-flop D1 (MC14013 or equivalent) and NAND gates N3 and N4 (MC14011 or equivalent) to produce pulses along lines MA, MB, CLOA and CLOB. As shown in the timing diagram adjacent generator TSIG, the pulses along line CLOA have a frequency corresponding to that of the free-running multivibrator with a pulse width equal to one-half a cycle. This frequency is selected to be rapid enough so that at least four complete cycles of pulses are produced along line CLOA during each output of transducer 101 along lines EA0-EA10 at the highest rotational speed of the transducer. The pulses along lines MA and MB are complements of each other and have a frequency equal to one-half that of the free-running multivibrator also with pulse widths equal to one-half a cycle. The pulses along line CLOB also have a frequency equal to one-half that of the free-running multivibrator but have a pulse width equal to three-quarters of a cycle.

Shown in FIG. 4 is the range portion of the first described embodiment. Selection switch SWB comprising three 4-bit AND/OR selector circuits of the Motorola MC14519 variety or the equivalent receives input signals in gray code from the second 11-bit encoder along lines EB0–EB10. It also receives inputs along lines S0–S10 and produces outputs along lines BG0–BG10 corresponding to one or the other set of inputs depending upon whether a pulse is applied to its selector circuits along line MB or MA.

The outputs of switch SWB along lines BG0–BG10 are applied to register BREG comprising eleven type D flip-flops of the Motorola MC14013 variety or the equivalent. These flip-flops provide outputs along lines $\overline{SB0}$–$\overline{SB10}$ in accordance with the inputs they receive along lines BG0–BG10 whenever a clock pulse appears on line CLOA.

The output signals from register BREG along lines $\overline{SB0}$–$\overline{SB10}$ are applied to one set of inputs of gray to binary converter BCON. This unit comprises three 4-bit AND/OR selector circuits of the Motorola MC14519 variety or the equivalent, and serves two functions. When signals appear along lines E1+ and MA it converts the signals along lines $\overline{SB0}$–$\overline{SB10}$ applied to its one set of inputs from gray code to the equivalent binary code and applies the binary code signals along its output lines B0–B10. During that half of each cycle of the signal applied along line MA when no pulse is present, converter BCON operates in response to the voltage applied constantly along line E1+ as a selection switch and transfers the inputs applied to it along lines $\overline{SB0}$–$\overline{SB10}$ to its output lines B0–B10.

The output signals from converter BCON along lines B0–B10 are applied to one set of inputs of subtracter SUBT which comprises three 4-bit Full Adder circuits of the Motorola MC14008 variety or the equivalent. As previously mentioned, the other set of inputs of subtracter SUBT receives the signals applied along lines $\overline{A0}$–$\overline{A10}$ by switch SWA and gates GAA of the resolution portion of the apparatus. When no pulse appears along line MB at the input of subtracter SUBT it operates to produce signals along its output lines S0–S10 signifying the sum of the input signals on its two sets of inputs. During the half of each cycle of the signal applied along line MB when a pulse is present subtracter SUBT operates to produce signals along its output lines signifying the sum of the input signals on its two sets of inputs plus a binary one as indicated by the pulse along line MB. The carry outputs K01 and K02 of the first two adder stages are connected to the carry inputs KI2 and KI3 of the second and third adder stages as is shown in the well-known manner.

The eight most significant outputs of subtracter SUBT are applied along lines S3–S10 to second register 2STO. All of the outputs from subtracter SUBT are applied as previously mentioned to selection switch SWB. Second register 2STO comprises eight type D flip-flops of the Motorola MC14013 variety or the equivalent, each of which operates in response to the reception of a pulse along line CLOB to transfer the signals on lines S3–S10 to lines R11–R18.

Shown in the block diagram of FIG. 5 is the second to be described embodiment of the invention. This embodiment comprises two signal generators PG1 and PG2 of the TRU Rota type DC-1024-D-11-M-SD-12V or equivalent which correspond to transducers 103 and 105 respectively. Signal generator PG1 produces similar pulsed output signals in two channels. The signal in one channel is applied along output line X and the signal in the other channel along output line Y. Depending upon the direction of rotation the signal along line Y either leads or lags the signal along line X by 90° or a quarter of a period of the respective signals. In accordance with earlier explanation 1,024 cycles of each signal are provided along each of lines X and Y, respectively for each revolution of signal generator PG1. In addition, signal generator PG1 produces a first index pulse along line IM1 each time the first reference point of shaft 101 is in a first angular position.

The output signals of signal generator PG1 produced along lines X and Y are applied to signal conditioner circuit COND1 which operates to produce signals along lines UD, $\overline{4DN}$ and 4U which cause bi-directional counter CN1 to produce output signals along lines PP0–PP11 signifying the angular position of the first reference point of shaft 101.

Counter CN1 also produces a signal along line $\overline{CO}$ whenever it is restored to an initial condition as a result of the reception of a predetermined number of signals from conditioner COND1, enough to fill the counter. The signals along line $\overline{CO}$ are applied to counter CN2 and cause it to produce signals along lines PP12–PP19 signifying the number of times the first reference point of shaft 101 passes through the previously mentioned first angular position.

Signal generator PG2 produces a second index pulse along line IM2 each time a second reference point of shaft 106 passes through a second angular position. A pulse signal along line IM2 applied to counter CN2 causes it to apply the signals it receives along lines PP4–PP11 from counter CN1 to lines PP12–PP19 so that if corresponding signals are not already existing on these latter lines they will then appear therealong.

Shown in FIG. 6 are the circuit elements which comprise signal conditioner COND1 and counters CN1 and CN2 of FIG. 5. Signal conditioner COND1 includes an oscillator OSC which produces pulses along line CLO and complementary pulses along line $\overline{CLO}$ at a frequency of 122.9 KHZ with a pulse width of one-half the period. Also included in the signal conditioner are a plurality of type "D" flip-flops Motorola MC14013 variety or equivalent, which receive the signals from signal generator PG1 along lines X and Y. These units are employed for producing signals along lines X1 and X2 and Y1 and Y2 in response to signals generated along lines X and Y. The signals along lines X1, X2, Y1 and Y2 are applied to three exclusive OR gates NO1, NO2 and NO3 (Motorola MC14507 variety or the equivalent) whose outputs are applied to a binary coded decimal or decimal decoder BCD (Motorola MC14028 variety or the equivalent). Decoder BCD together with a pair of NOR and inverter gates U1, U2, D1 and D2 (Motorola MC14001 and MC14049 variety, respective or the equivalent) produces signals along lines 4U, 4DN and $\overline{4DN}$. Depending upon the direction of rotation four pulses are produced along line 4U or 4DN for each cycle of the signals produced along lines X and Y by signal generator PG1. The signals along line $\overline{4DN}$ are the complements of the signals along line 4DN. The signals along lines 4U and 4DN in conjunction with two NOR gates NA1 and NA2 (Motorola MC14001 variety or the equivalent) produce signals along line UD.

Bi-directional counter CN1 comprises three 4-bit binary up-down counters BC1, BC2 and BC3 connected in series. Bi-directional counter CN2 comprises two such 4-bit binary up-down counters BC4 and BC5. Each of counters BC1–BC5 is a Motorola MC14516 variety or the equivalent. As shown each of the four data lines P1–P4 of each counter BC1–BC3 are connected to ground potential and those signals are applied to the output lines of counter CN1 whenever a signal is applied to that counter along line IM1. The eight most significant output lines PP4–PP11 of counter CN1 are shown connected to the data lines P1–P4 of each of the counters BC4–BC5 comprising bi-directional counter CN2. The signals applied along those latter lines are applied to the output lines of counter CN2 whenever a signal is applied to that counter along line IM2. Each of the counters BC1–BC5 are also shown connected in series in the well-known manner.

FIG. 7 illustrates a block diagram of another embodiment of the invention. This embodiment comprises signal generators PG3 and PG4 which correspond to transducers 103 and 105, respectively. Signal generator PG3 produces output signals on two channels which are applied along output lines X3 and Y3. These signals are similar to the signals applied along output lines X and Y of pulse generator PG1 previously described with regard to FIG. 5. In addition signal generator PG3 produces an index signal along line IM3 which transfers from a first level to a second level each time the first reference point of shaft 101 is in the first angular position and then transfers from the second level to the first level each time the first reference point of shaft 101 is rotated 180° from the first angular position. This index signal is applied along line IM3 to signal conditioner COND2 along with the signals applied along lines X3 and Y3.

Signal generator PG4 produces an index signal along line IM4 which transfers from a first level to a second level each time the second reference point of shaft 106 is in the second angular position and transfers from the second level to the first level each time the second reference point of shaft 106 is rotated 180° from the second angular position. This index signal is applied along line IM4 to signal conditioner COND2.

The output signals of signal generator PG3 produced along lines X3, Y3, and IM3 and of signal generator PG4 produced along line IM4 are applied to the circuits of signal conditioner COND2 to produce signals which are applied along lines 3Q11, IM3BSTB, U10 and 4XUD to bi-directional counter CN3. In addition signal conditioner COND2 also produces signals which are applied along lines BE, $\overline{BE}$, and IM4BSTB to gates XOR8 and NOG4 and to bi-directional counter CN4. The signal along line U10 is also applied to bi-directional counter CN4.

The output signals of counter CN3 representing the angular position of the first reference point of shaft 101 are applied along lines 3P0–3P11. Counter CN3 also produces a carry signal which is applied along line CO30 to counter CN4 whenever counter CN3 is restored to its initial condition in response to the reception of a predetermined number of pulses. This restoration is accomplished in the same manner as previously described with respect to counter CN1 of FIGS. 5 and 6. The signal on line 3P11 is also applied to gate NOG4 and cooperates with the signal applied along line $\overline{BE}$ to produce an output signal from gate NOG4 which is applied along line CO40 to full adder ADD1. Full adder ADD1 operates to produce signals which are applied along lines 4P4–4P10 to bi-directional counter CN4. In addition full adder ADD1 produces a signal which is applied along line 4P11A to gate XOR8. Gate XOR8 operates in response to the signals applied to it along lines 4P11A and BE to produce an output signal which is applied along line 4P11 to bi-directional counter CN4.

Bi-directional counter CN4 responds to the carry signals applied to it along line CO30 to produce output signals along lines 3P12–3P19 representing the number of carry signals received. In addition the signal applied to counter CN4 along line IM4BSTB causes it to apply the signals it receives along lines 4P4–4P11 from full adder ADD1 and gate XOR8 to lines 3P12–3P19 so that if corresponding signals are not already existing at these latter lines they will thereupon appear therealong.

Shown in FIG. 8A are the circuit elements which comprise signal conditioner COND2. Signal conditioner COND2 includes a plurality of buffer amplifiers B1, B2, B3, B4 of the Fairchild "Dual Differential Line Receivers", type AM9615 or equivalent which receive the signals from pulse generators PG3 and PG4 applied along lines X3, Y3, IM3 and IM4 respectively. Amplifier B1 and B2 produce a pulse along line X3B and Y3B, respectively for each cycle of the signal applied along line X3 and Y3 in the well-known manner. Amplifier B3 and B4 produce a pulse along line IM3B and IM4B for each signal applied along line IM3 and IM4 respectively. Also included in signal conditioner COND2 are a plurality of "COS/MOS 4-bit D Type Registers'-'DIC1 and DIC2 of the RCA type CD4076BE or equivalent. Units DIC1 and DIC2 are employed for producing signals along lines X3B1, X3B2, Y3B1, Y3B2 and lines IM3B1, IM3B2, IM4B1, IM4B2 in response to signals applied along lines X3B, Y3B and lines IM3B, IM4B respectively.

Also illustrated in FIGS. 8A and 8B are a plurality of exclusive OR gates XOR1–XOR8 of the Motorola "Quad Exclusive OR Gate" type MC14507 or equivalent; a plurality of NAND gates NND2–NND3 of the Motorola "Quad Two Input Nand Gate" type MC14011 or equivalent; a plurality of NOR gates NOG1–NOG4 of the Motorola "Quad Two Input NOR Gate" type MC14001 or equivalent and inverting amplifiers IA3–IA5 of the Motorola "Hex Inverter" type MC14049 or equivalent.

The signals on lines IM3B1 and IM3B2 from register DIC1 are applied to exclusive OR gate XOR1 (FIG. 8A) which has its output signal applied to counter BUD1–BUD3 (FIG. 8B).

Oscillator OSC2, is a free running type which produces pulses at a frequency of 131 k Hz. which are applied to lines CLO1 and $\overline{CLO1}$. The pulses on line $\overline{CLO1}$ are the complement of those on line CLO1. Line CLO1 is connected to counter BUD1–BUD5 (FIG. 8B). Line $\overline{CLO1}$ is connected to register DIC1. At least four pulses are produced along line CLO1 during each quarter cycle of the signals along lines X3 and Y3 at the highest speed of signal generator PG3 in order that later to be described equipment can produce four pulses as a result of each such cycle.

Also shown in FIG. 8A is exclusive OR gate XOR3 which receives signals applied to it along lines X3B1 and Y3B2 from register DIC1 to produce signals which are applied to input B of binary coded decimal to decimal decoder BCD3 of the Motorola type MC14028 or equivalent. In addition unit BCD3 receives signals applied to inputs A and C along lines Y3B1 and X3B2 respectively from unit DIC1. As shown signals from the number 1 and 4 of output lines of unit BCD3 are applied to the input of NOR gate NOG1 and signals from the number 2 and 7 output lines of unit BCD3 are applied to the input of NOR gate NOG2. The signals produced by NOR gates NOG1 and NOG2 are applied along lines $\overline{4XU}$ and $\overline{4XD}$ to inverting amplifiers IA3 and IA4 respectively to produce signals along lines 4XU and 4XD which are quadruple multiples of the signals applied along the lines X3B and Y3B. The signal on line $\overline{4XU}$ is also applied to one of the inputs of NAND gate NND2 which has its other input connected to line D10 to produce a binary signal which is applied along line U10 to counters CN3 and CN4. Similarly NAND gate NND3 has signals applied to it along lines $\overline{4XD}$ and U10 to produce signals on line D10.

NOR gate NOG3 combines the signals applied to it along lines 4XU and 4XD and applies signals along line 4XUD to the input of the first of the three binary UP-/DOWN counters BUD1, BUD2 and BUD3 (FIG. 8B) each of the Motorola type MC14516 or equivalent which comprise counter CN3. As shown in FIG. 8A exclusive OR gate XOR5 receives signals applied to it along lines IM3B2 and D10 and generates a signal on its output line which is applied to one input of exclusive OR gate XOR6, the other input of which is connected to ground. Exclusive OR gate XOR6 has its output line 3Q11 connected to counter CN3 (FIGS. 7 and 8B). The remaining input lines 3Q0–3Q10 of counter CN3 (FIG. 8B) are each connected to ground.

Bi-directional counter CN3 is connected in series by means of line CO30 to counter CN4 comprising a pair of series connected UP/DOWN counters BUD4 and BUD5. Each of the UP/DOWN counters BUD4 and BUD5 is also a Motorola type MC14516 or equivalent. In addition to producing signals on lines 3P0–3P11 signifying the angular position of the first reference point of shaft 101, counter CN3 applies the eight most significant bits along lines 3P4–3P11 to binary full adder ADD1.

Binary full adder ADD1 comprises two series connected "Four Bit Full Adders" ADDA and ADDB of the Motorola type MC14008 or equivalent. As shown in FIG. 8B data inputs A1A8 of full adder ADD1 are connected to ground. Full adder ADD1 has a carry signal applied to it along line CO40 from the output of NOR gate NOG4. NOR gate NOG4 receives signals applied to it along lines 3P11 and $\overline{BE}$. The signal applied along line $\overline{BE}$ is produced by inverter IA5 and is the complement of the signal generated by exclusive OR gate XOR7 (FIG. 8A) in response to the signals applied that gate along lines IM4B2 and D10.

In response to a pulse signal applied to it along line IM4BSTB counter CN4 operates to apply the signals it receives along lines 4P4–4P11 to lines 3P12–3P19 if corresponding signals are not already existing on these latter lines. The signal on line 4P11 produced by exclusive OR gate XOR8 in response to the signals applied to it along lines BE and 4P11A and the remaining signals on lines 4P0–4P10 obtained directly from full adder ADD1 represent in binary form the number of revolutions of the first reference point of shaft 101.

In order to understand the operation of all embodiments of the invention, a description of operation of each will be provided. Accordingly, assume that when the first and second reference points of shafts 101 and 106 of an arrangement built in accordance with the first embodiment shown in FIGS. 2, 3 and 4 are in first and second angular positions respectively, the binary encoders corresponding to transducers 103 and 105 each produces a gray code output equivalent to zero. From the foregoing it will be understood that the encoder of shaft 101 produces 2,048 separate 11-bit signals for each rotation of its associated gear 102 through 255 teeth or 360 degrees. The encoder on shaft 106 also produces 2,048 separate output signals for rotation of its gear 104 through 360 degrees. This gear contains 256 teeth however and for each revolution of gear 102 through 255 teeth gear 104 rotates 255 teeth also which is one tooth less than 360 degrees for gear 104. As a result the encoder of shaft 106 produces eight less output signals than the encoder on shaft 101 for every revolution of that latter shaft.

From the foregoing it is also to be understood that because of the discrete character of the output signals from the encoders on shafts 101 and 106, the signals from the encoder are produced out of synchronism with each other except each time the first reference point of shaft 101 is in the first angular position. This asynchronism between the production of the signals of the encoders is compensated for in order that correct indications of the angular position of the reference point of shaft 101 are produced at every position of that shaft in each of its revolutions. The following description of operation will be explained as taking place at one particular position of shaft 101 in order that it might be understood how the embodiment provides accurate indications of angular position of the first reference point of shaft 101.

Since gear 104 travels one tooth less than gear 102 for every rotation of gear 102, it should also be understood that on each successive rotation of shaft 101 the angular position of the second reference point on shaft 106 increasingly lags the angular position of the first reference point on shaft 101 if the shafts are started in rotation with the first and second reference points in the first and second angular positions, respectively. This lag angle increases the same amount for each rotation and thus it is indicative of the number of rotations of shaft 101.

In order to understand how the embodiment of FIGS. 3 and 4 operates to indicate the angular position of the first reference point of shaft 101, assume shafts 101 and 106 are started in rotation with the first and second reference points in the first and second angular positions respectively. Also assume that shaft 101 is on a particular rotation and that the first reference point has travelled more than seven-eighths of the way through that rotation from the first angular position.

Under these circumstances signals are applied to lines EA0–EA10 to register AREG which signify in gray code the angular position of the first reference point of shaft 101 in that particular rotation. Simultaneously signals are applied to lines EB0–EB10 to selection switch SWB which signify in gray code the position of the second reference point of shaft 106. Also assume that timing signal generator TSIG has just generated a new pulse along line CLOA and that the corresponding pulse along line MA has not yet been generated. As a result a pulse magnitude still appears along line MB and switch SWB applies the signals along lines EB0–EB10 to lines BG0–BG10. Accordingly when the pulse along line CLOA was generated and the type D flip-flops of register BREG caused the signals along lines BG0–BG10 to be produced along lines $\overline{SB0}$–$\overline{SB10}$, signals indicative of the angular position of the second reference point of shaft 106 are applied to one set of inputs of gray to binary code converter BCON. Consequently when sufficient time elapses that timing signal generator TSIG generates a pulse along line MA converter BCON generates signals along lines B0–B10 which in binary code signify the angular position of the second reference point of shaft 106.

Upon the generation of the pulse along line MA timing signal generator TSIG also generates a pulse along line CLOB. In response to a pulse applied along line CLOB the type D flip-flops of register AREG cause the 11 gray code signal bits applied to them along lines EA0–EA10 to be produced on lines AG0–AG10. In addition the complements of the signals applied along line EA3 and EA10 are produced along line $\overline{AG3}$ and $\overline{AG10}$. The three least significant bits of the signal which in gray code signifies the angular position of the first reference point of shaft 101 are applied along lines AG0–AG2 to gray to binary converter ACON. These signal bits together with the complement of the fourth least significant bit applied along line $\overline{AG3}$ to converter ACON provide along lines $\overline{CA0}$–$\overline{CA3}$ the complements of the four least significant bits in binary code corresponding to the four least significant bits in gray code. The seven most significant gray code bits generated by the encoder on shaft 101 are applied along lines AG-4–AG10 to converter ACON to produce along lines CA4–CA9 the fifth through tenth most significant bits in binary code corresponding to the similar bits of the gray code position signal. The eleventh or most significant bit need not be converted from gray to binary code since it always is the same in both. This most significant bit along line AG10 together with the next six most significant bits along lines CA4–CA9 are applied to gates GAA which in the presence of a pulse along line MA produce along lines $\overline{A4}$–$\overline{A10}$ the complements of the seven most significant bits of the signals in binary code indicative of the position of the first reference point of shaft 101.

Simultaneously the signals along lines $\overline{CA0}$–$\overline{CA3}$ are applied to selection switch SWA which in the absence of a pulse along line MB and the presence of a pulse along line MA transfers these four signals signifying the complements of the four least significant bits of the binary code signal indicative of the position of the first reference point of shaft 101 to the output lines $\overline{A0}$–$\overline{A3}$. The complements of the eleven binary code signal bits indicative of the position of the first reference point of shaft 101 are applied along lines $\overline{A0}$–$\overline{A10}$ to the second set of inputs of subtractor SUBT. As previously explained subtractor SUBT is at that time also receiving binary coded signals along lines B0–B10 on its other set of inputs. These latter signals are indicative of the angular position of the second reference point of shaft 106. In the absence of a pulse along line MB subtractor SUBT operates as a summing circuit to add the signals along lines B0–B10 to the signals along lines $\overline{A0}$–$\overline{A10}$. As explained, the signals along line A0–A10 are the complements of the binary signals representing the angular position of the first reference point of shaft 101. Accordingly, subtractor SUBT produces on lines S0–S10 a binary signal indicative of the difference between the signals representing the angular position of the second reference point of shaft 106 and the signals representing the angular position of the first reference point of shaft 101, or the angle by which the angular position of the second reference point of shaft 106 lags that of the first reference point of shaft 101.

With shaft 101 within the last eighth portion of any rotation, as is the assumed condition, the asynchronisms between the production of signals by the two encoders causes the difference signals along lines S0–S10 to indicate an erroneous number of rotations of shaft 101. This occurs because in this position when the encoder on shaft 101 produces a signal before the production of the corresponding signal by the encoder on shaft 106 the former encoder has produced eight more signals on this rotation of shaft 101 than the latter encoder has. From earlier explanation it should be understood that eight signals are equivalent to one tooth of gear 104. Consequently these eight signals signify that the second reference point on shaft 106 lags the first reference point on shaft 101 by an angle equivalent to another full rotation. Since this occurs before the completion of the rotation it has to be prevented from causing the difference between the two signals applied to subtractor SUBT from causing inaccurate indications of the number of rotations of the first reference point of shaft 101 past the first angular position. Switch SWB, register BREG, converter BCON, subtractor SUBT and switch SWA operate as a compensating circuit during the presence of pulses along line MB in order that accurate indications are produced during such times.

To accomplish this compensation function, the output signals from subtractor SUBT along lines S0–S10 are applied to the second set of inputs of switch SWB. Consequently, before the reception of a pulse along line MB and while a pulse continues to be applied along line MA, the output lines BG0–BG10 of switch SWB have applied along them the lag angle signals from subtractor SUBT. When a pulse is generated along line CLOA at the end of the pulse along line MA the eleven type D flip-flops of register BREG cause complements of the lag angle signals to be applied along lines $\overline{SB0}$–$\overline{SB10}$. These signals are applied to converter BCON which in the absence of a pulse along line MA operates as a selection switch and transfers these complement signals to lines B0–B10.

Since the pulse along line MA has ceased and that along line MB has begun, gates GAA are inhibited and thus each of lines $\overline{A4}$–$\overline{A10}$ has a binary one applied along it. In addition, in response to the pulse along line MB switch SWA selects the input signals on lines E1+, $\overline{AG10}$, $\overline{CA9}$ and $\overline{CA8}$ and transfers those signals to its output lines $\overline{A0}$–$\overline{A3}$. The signals along lines $\overline{CA8}$, $\overline{CA9}$ and $\overline{AG10}$ represent the complements of the three most significant bits of the binary number indicative of the position of the first reference point of shaft 101. During each revolution of shaft 101 when its first reference point is traveling through the last eighth of a rotation toward the first angular position the signals signifying these three most significant bits comprise a compensating signal which is of sufficient magnitude that when subtracted from the lag angle signal generated during the MA pulse the asynchronisms between the generation of signals from the two encoders are prevented from producing a lag angle signal which produces inaccurate indications of position. This subtraction is accomplished by applying the binary signals along line $\overline{A10}$–$\overline{A4}$ and that along line $\overline{A3}$ resulting from the binary one signal on line E1+ together with the signals along lines $\overline{A0}$–$\overline{A2}$ indicative of the complements of the three most significant bits of the binary code signal representing the position of the first reference point to the associated set of inputs of subtractor SUBT. With these signals applied to one set of inputs and the complement of the lag angle signal applied to the other set of inputs along lines B0–B10 subtractor SUBT during the presence of a pulse along line MB, produces along lines S0–S10 the difference between the lag angle signal and the compensating signal. The eight most significant bits along lines S3–S10 are applied to the eight type D flip-flops of register 2STO. Upon the next generation of the pulse along line CLOB, these produce output signals along lines R11–R18 which are accurate indications of the integral number of teeth of gear 104 by which the angular position of the second reference point of shaft 106 lags the angular position of the first reference point of shaft 101. As stated previously, this indicates the number of rotations the first reference point of shaft 101 has rotated past the first angular position since the assumed initial condition in which the first reference point and the second reference point were simultaneously in the first and second angular position, respectively. When the binary number represented by the eight bits on lines R11–R18 are combined with the eleven bits on line R0–R10 a digital number is produced signifying the angular position of the first reference point of shaft 101 and the number of rotations of shaft 101.

It is to be understood that although the pulse along line MB ceases and that along line MA starts substantially simultaneously with the generation of the pulse along line CLOB, the operation time of subtractor SUBT is sufficiently slower in switching its output from the compensated lag angle signal to the uncompensated signal in response to the cessation of the pulse along line MB that the compensated signal is produced along lines R11–R18 as outputs by the eight type D flip-flops of register 2STO.

In order to understand how the embodiment of FIGS. 5 and 6 operates to indicate the angular position of the first reference point of shaft 101, assume that the first and second reference points of shafts 101 and 106 are in their first and second angular positions and that pulse generator PG1 and pulse generator PG2 are simultaneously producing their index pulses along lines IM1 and IM2. Also assume that shafts 101 and 106 are turning in a direction in which binary counters CN1 and CN2 will increase their count as the angular rotation of shaft 101 increases. From what has been explained previously, it will be understood that pulse generator PG1 produces 1,024 electrical pulses along each of lines X and Y for each revolution of shaft 101. Also, with the rotation of shaft 101 such as to increase the count in counters CN1 and CN2 the pulses along line Y lead those along line X as previously mentioned.

It is to be understood that the pulses produced by oscillator OSC along lines CLO and $\overline{CLO}$ are such in relationship to the fastest speed at which pulse generator PG1 rotates that at least four pulses appear on each of lines CLO and $\overline{CLO}$ between each pulse generated along line X and each pulse generated along line Y. As a result for each pulse along lines X and Y type D flip-flops 1X, 2X and 1Y, and 2Y produce output signals along each of lines X1, X2, Y1 and Y2. These output signals are applied to the exclusive OR gates NO1, NO2 and NO3 whose outputs are applied in turn to three inputs of decoder BCD. With the production of pulses in the Y channel 90 degrees in advance of pulses in the X channel signals are applied along lines Y1, Y2, X1 and X2 in that order. The production of a pulse along line Y1 causes exclusive OR gate NO1 to apply a signal to the A input of decoder BCD. As a result a corresponding signal appears at output 1 of the decoder. This is transmitted to the associated NOR and inverter gates U1 and U2 and causes the production of a pulse along line 4U. Similarly the production of a pulse along line Y2 causes exclusive OR gate NO2 to apply a signal to input B of decoder BCD without effect at this time since output 3 of decoder BCD which produces an output signal when input signals are applied to the A and B inputs of the decoder is not connected in the circuit. The production of a pulse along line X1 causes exclusive OR gate NO3 to provide a signal to the C input of decoder BCD. With input signals on its A, B and C inputs, decoder BCD produces an output signal on its 7 output. This is applied to the associated NOR and inverter gates U1 and U2 and produces a second pulse along line 4U.

When the pulse applied along line X2 is applied to OR gates NO1, NO2 and NO3 each ceases to produce an output signal. Thereafter, a clock pulse applied along line $\overline{CLO}$ causes type D flip-flop 1Y to remove the pulse signal on line Y1. This causes exclusive OR gate NO1 to again apply a signal to input A of decoder BCD. As before, this causes the production of a pulse along line 4U. Similarly the removal of the pulse signals along lines Y2 and X1 will cause the production of a signal from output 7 of decoder BCD and another pulse will be produced along line 4U. In this way each cycle of the signals produced along line X and Y results in the production of four pulses along line 4U so that each rotation of signal generator PG1 in the assumed direction results in the production of 4,096 pulses along line 4U, which means that 16 such pulses are produced for each angle of rotation equivalent to one tooth of gear 102.

Each pulse along line 4U causes NOR gates NA1 and NA2 to produce corresponding pulses along line UD. These pulses along line UD, in the well-known manner, enable binary up-down counters BC1–BC5 to increase their count each time a pulse is applied to input CI1 to counter BC1 from exclusive NOR gate NO4 as a result of a pulse along line 4U.

Outputs are applied along lines PP0–PP11 in accordance with the number of pulses applied to input CI1 of counter BC1 and the corresponding inputs CI2 and CI3 of counters BC2 and BC3 as a result of the preceding counters BC1 and BC2 being filled. Upon the production of 4,096 pulses along line 4U all of the counters BC1 through BC3 are filled with the result that an output is produced at the CO3 output of counter BC3. This is applied along line $\overline{CO}$ to input CI4 of counter BC4 which together with counter BC5 produces output signals along lines PP12–PP19 in accordance with the number of inputs applied along line $\overline{CO}$ to input CI4.

On each return of the first reference point of shaft 101 to the first angular position, 4,096 pulses should have been produced on line 4U such that counters BC1–BC3 have been restored to their initial condition in which they produce a zero count on lines PP0–PP11. To insure that counters BC1–BC3 are restored to their initial condition upon the return of the first reference point of shaft 101 to the first angular position notwithstanding that one or more pulses have not been counted, an index pulse is produced along line IM1 when the first reference point of shaft 101 is in the first angular position. This index pulse is applied along line IM1 to the PE inputs of each of counters BC1–BC3 and causes the ground potential on lines P1–P4 of each counter to be transferred to the output lines PP0–PP11 restoring the counters to their initial condition if they aren't already in that condition.

As will be understood, on each rotation of shaft 101 the angular position of its reference point increasingly leads the angular position of the second reference point on shaft 106 because of the one more tooth on gear 104 than on gear 102. Specifically, each time the second reference point of shaft 106 returns to the second angular position, and signal generator PG2 produces an index pulse along line IM2, the first reference point of shaft 101 is beyond the first angular position by precisely one more tooth of gear 102. This effect is cumulative and with the arrangement of binary counter BC1-BC3 each providing four output signal bits, together with the fact that 16 pulses are applied along line 4U for each angle of rotation of shaft 101 equivalent to one tooth of gear 102 each time the index pulse of signal generator PG2 is applied along line IM2 counters BC2 and BC3 contain a number equivalent to the number of teeth gear 102 has rotated through since the first reference point of shaft 101 was last in the first angular position. This number is equivalent to the number of rotations of shaft 101. It is caused to be transferred to output lines PP12 through PP19 of counters BC4 and BC5 as a result of the application of the second index pulse along line IM2 to the PE inputs of counters BC4 and BC5. Since, as is known, the application of such a pulse operates to transfer the signals on lines PP4 through PP11 to lines PP12 to PP19 so that if corresponding signals do not already exist on the latter lines they will thereupon appear therealong.

From the foregoing it can be seen that should counters BC4 and BC5 fail to count the carry signals from counter BC3 applied along line $\overline{CO}$ properly the count in counters BC4 and BC5 will be corrected as soon as signal generator PG2 produces its index pulse in response to the second reference point of shaft 106 returning to its second angular position. Similarly should the source of electrical power be lost on any revolution of shaft 101 a correct indication of the total number of rotations of that shaft from the point at which both the first and second index pulses were generated in synchronism together with a correct indication of the angular position of the first reference point of that shaft will be produced upon the first generation of a second index pulse along line IM2 following the first generation of a first index pulse along line IM1 after the restoration of the source of electrical power.

Operation of this embodiment in response to rotation of shafts 101 and 106 such that the counters reduce the numbers stored therein occurs in response to the generation of pulses along line 4DN which are produced in a manner similar to those applied along line 4U in response to the signal on line X leading that on line Y. During this operation counters BC1-BC5 reduce their count in response to the absence of pulses along line UD. These operations will be apparent to those skilled in the art in view of the foregoing description and will not be explained in detail herein for purposes of brevity.

In order to understand how the embodiment of FIGS. 7, 8A and 8B operates to signify the angular position of the first reference point of shaft 101 assume that the first and second reference points of shafts 101 and 106 are in their first and second angular positions respectively. Also assume that as a result of the assumed positions of the reference points of shafts 101 and 106, signal generators PG3 and PG4 produce signals which have simultaneously transferred from a first logic level represented by a binary one to a second logic level represented by a binary zero. In addition it is assumed that the signal applied along line IM3 remains at that binary zero level until the first reference point of shaft 101 has rotated 180° from its first angular position in a clockwise direction and the signal applied along line IM4 remains at that binary zero level until the second reference point of shaft 106 has rotated 180° from its second angular position in a counterclockwise direction at which position of shafts 101 and 106 the signals applied along lines IM3 and IM4 are transferred to a logic level represented by a binary one. It is understood that since gear 102 has one less tooth than gear 104 the second reference point of shaft 106 increasingly lags the first reference point of shaft 101 and that this effect is cumulative with each revolution of shaft 101.

Assume that as shaft 101 rotates through each revolution of 360°, signal generator PG3 applies 1,024 cycles of an electrical signal along each of lines X3 and Y3 and in addition that as shaft 101 rotates in a clockwise direction the signals applied along line Y3 lead the signals applied along line X3 by 90°. It is understood that as shaft 101 is rotated through each revolution of 360° in a counter-clockwise direction, signal generator PG3 also applies 1,024 cycles of the signals along each of lines X3 and Y3 but that the signals applied along line Y3 lag the signals applied along lines X3 by 90°. From this phase relationship of the signals applied along lines X3 and Y3 the signal conditioner COND2 determines the direction of rotation of the shaft 101 as it is rotated and in response to the assumed clockwise rotation of shaft 101 produces binary one signal pulses on the output of NAND gate NND2 in a manner to be described. These signals are applied along line U10 to cause bi-directional counters CN3 and CN4 to increase their count in response to the pulses applied to counter CN3 along line 4XUD as the angular position of shaft 101 is rotated in the clockwise direction. If the assumed rotation of shaft 101 had been reversed NAND gate NND2 would have applied a zero binary level signal to counters CN3 and CN4 as a result of the signals applied along line Y3 lagging the signals applied along line X3 and the count stored in those counters would be decreased in response to the pulses applied to counter CN3 along line 4XUD.

As a result of the initial assumed position, binary zero level signals are applied along lines IM3 and IM4 to the input of inverting differential amplifiers B3 and B4 (FIG. 8A) respectively which apply binary one signals along lines IM3B and IM4B to register DIC2. Before rotation of shaft 101 from its initial assumed position no signals were present on lines 4XU and 4XD and consequently the output of exclusive OR gate XOR4 was a binary zero and the signals on lines IM3B and IM4B were not clocked into register DIC2. As a result binary zeros were applied along lines IM3B1, IM3B2, IM4B1 and IM4B2 o exclusive OR gates XOR1 and XOR2 each of which produces a binary zero signal.

Before shaft 101 begins to rotate in a clockwise direction, signal generator PG3 is applying the negative half of the first cycle of the signal along line Y3 to the input of inverting differential amplifier B2. This causes the amplifier to apply a binary one signal along data line Y3B to register DIC1. Register DIC1 responds to this signal on line Y3B and a clock pulse along line $\overline{CLO1}$ to generate a signal along line Y3B1 which is applied to binary to decimal converter BCD3. This signal causes a binary one output signal to be produced from the 1 output of the converter which is applied to the associated input of NOR gate NOG1. This gate in turn produces a binary zero along line $\overline{4XU}$ which is applied to inverter IA3 and causes it to produce a binary one signal on line 4XU. Each binary one signal along line 4XU is applied to NAND gate NND2 causing it to apply a binary one signal along line U10. Each binary one signal along line 4XU is also applied to exclusive OR gate XOR4. The first of these, applied to register DIC2 to cause it to produce a binary one signal on line IM3B1 and IM4B1 in response to the binary one signal on lines IM3B and IM4B. These binary one signals on line IM3B1 and IM4B1 are applied to exclusive OR gates XOR1 and XOR2 which produce binary one signals on lines IM3BSTB and IM4BSTB, respectively.

The binary one signal along line 4XU was also applied to NOR gate NOG3 to cause the production of a binary one signal along line 4XUD which is applied to input CIN1 of counter BUD1. This signal is without effect at this time however because the binary one signal applied along line IM3BSTB to the PE inputs of counters BUD1-BUD3 cause the ground or binary zero signal applied to each of lines 3Q0-3Q10 to be applied to lines 3P0-3P10. At the same time a binary zero signal is also applied along line 3Q11 as a result of binary zero signals applied along line IM3B2 and D10 to exclusive OR gate XOR5. This signal along line 3Q11 is transferred to line 3P11 by counter BUD3 in response to the binary one signal applied along line IM3BSTB.

Lines 4P4-4P11A receive the signals applied along lines 3P4-3P11 from adders ADDA and ADDB as a result of the input signal along line CO40 being in the binary zero state. This state exists as a result of the binary zero signal on line 3P11 to NOR gate NOG4 and the binary one signal applied thereto along line $\overline{BE}$. This latter signal is in the binary one state as a result of the application of binary zero signals along lines IM4B2 and D10 to exclusive OR gate XOR7. As a consequence, the signal along line BE is in the binary zero state. This signal and the binary zero signal along line 4P11A are both applied to exclusive OR gate XOR8 (FIG. 8B) and cause the production of a binary zero signal along line 4P11. The existence of a binary one signal along line IMB4STB, as previously mentioned, under these conditions causes counters BUD4 and BUD5 to produce binary zero signals on lines 3P12-3P19. With binary zero signals on all lines 3P0-3P19 counters BUD1-BUD5 are all in their initial condition. Additional pulses along line $\overline{CLO1}$ are without significant effect while shaft 101 remains stationary. The first additional one of these pulses applied along line CLO1 causes register DIC1 to produce a binary one output on line Y3B2 in response to the binary one signal on line Y3B1. This is applied through exclusive OR gate XOR3 to the B input of converter BCD3 which causes the binary one signal at the 1 input to return to binary zero. This causes NOR gate NOG1 to produce a binary one signal along line $\overline{4XU}$ and a binary zero signal through inverter IA3 on line 4XU. This binary zero signal cause exclusive OR gate XOR4 to produce a binary zero signal without effect.

Assume now that shaft 101 starts to rotate in the clockwise direction. As mentioned, under this condition the signals on line Y3 lead those on line X3 by 90°. In order to understand how the signals from generators PG3 and PG4 cause counters BUD1-BUD5 to produce outputs indicative of the rotation of shaft 101, a brief description of the manner of generation of pulses along line 4XUD follows.

The next significant clock pulse applied along line $\overline{CLO1}$ to register DIC1 occurs when a binary one signal is applied to that register along line X3B. This clock pulse causes register DIC1 to apply a binary one signal along line X3B1 to the second input of exclusive OR gate XOR3. As a result exclusive OR gate XOR3 applies a binary zero signal to the B input of converter BCD3. It is understood that the binary one signal is still applied along line Y3B1 to the A input of converter BCD3. As a result converter BCD3 produces a binary one signal on its output line 1 which is applied to NOR gate NOG1 causing a binary one signal on line 4XU and a binary zero signal on line $\overline{4XU}$. This binary one signal along line 4XU is applied to exclusive OR gate XOR4 to cause register DIC2 to apply the binary one signals on lines IM3B1 and IM4B1 to lines IM3B2 and IM4B2. These latter two signals cause the binary one signals on lines IM3BSTB and IM4BSTB to be transferred to binary zero signals in order to permit counters CN3 and CN4 to count pulses applied on line 4XUD.

The next clock pulse applied to register DIC1 causes it to apply a binary one signal along line X3B2 to input C of converter BCD3. In response to the binary one signal on its input C converter BCD3 produces binary zero signals on each of its output lines 1, 2, 4 and 7. As a result the binary zero signal applied along line $\overline{4XU}$ is transferred to a binary one and the binary one signal applied along line 4XU is transferred to a binary zero.

Because the signals applied along line Y3 lead the signals applied along line X3 as a result of the assumed direction of rotation it is understood that at the end of the first half cycle of the signal applied along line Y3 to amplifier B2, that amplifier applies a binary zero signal along line Y3B to register DIC1. The first clock pulse applied to register DIC1 after the binary zero signal is applied along line Y3B to that register causes it to apply the binary zero signal on line Y3B along line Y3B1 to converter BCD3 on input 1. At this time, it is understood, binary one signals are applied to each input of exclusive OR gate XOR3 along lines Y3B2 and X3B1 and in addition a binary one signal is applied along line X3B2 to input C of converter BCD3. In response to the signals applied to it converter BCD3 applies a binary one signal from its output line 4 to NOR gate NOG1 which causes a binary one signal to appear on line 4XU. The next clock pulse causes register DIC1 to apply the binary zero signal on line Y3B1 to line Y3B2. As a result exclusive OR gate XOR3 applies a binary one signal to the B input of converter BCD3 which in response applies a binary zero signal to each of its output lines 1, 2, 4 and 7.

It is further understood that as a result of continued clockwise rotation a binary zero signal is applied along line X3B to register DIC1 from amplifier B1. The next clock pulse applied to register DIC1 causes it to apply the binary zero signal on line X3B along line X3B1 to one input of exclusive OR gate XOR3. At this time it is understood the binary zero signals are applied along line Y3B2 to the second input of gate XOR3 and along line Y3B1 to converter BCD3. At the same time a binary one signal is still applied along line X3B2 to the C input of converter BCD3 which as a result applies a binary one signal from its output 4 to one input of NOR gate NOG1. As a result a binary one signal is applied along line 4XU. When the next clock pulse is applied to register DIC1 it causes the register to apply the binary zero signal on line X3B1 along line X3B2 to the C input of converter BCD3. As a result of the binary zero signals applied to each of its inputs A, B, C and D, converter BCD3 applies a binary zero signal along each of its output lines to NOR gates NOG1 and NOG2.

From the foregoing, it is to be understood that in response to each binary one signal applied to NOR gate NOG1 a corresponding binary one signal is applied along line 4XU. Consequently when the signals on line Y3 lead the signals on line X3 four pulses are applied along line 4XU for each cycle on the signal along line Y3 to amplifier B2. Similarly when the signals applied along line X3 lead the signals applied along Y3 four pulses are applied along line 4XD for each cycle of the signal applied along line X3 to amplifier B1.

As shown in FIG. 8A, the signals on lines 4XU and 4XD are applied to the input of NOR gate NOG3. As a result of what has been explained it is understood the NOR gate NOG3 applies 4,096 pulses per revolution of shaft 101 along line 4XUD to the input of counter CN3 regardless of the direction of rotation of shaft 101.

It is to be understood that the output of counter CN3 signifies the position of the first reference point of shaft 101 and counter CN4 signifies the number of revolutions of that shaft. As shaft 101 is rotated in the assumed direction counter CN3 responds to the signals applied it on line 4XUD while counter CN4 responds to the carry signals applied to it on line CO30 in the ordinary manner of pulse accumulators such as explained with respect to counters CN1 and CN2 of the embodiment of FIGS. 5 and 6. However as will be shown should either counter signify incorrectly the position of the first reference point of shaft 101 corrections are applied to each of the counters during each revolution of shaft 101.

To illustrate the occurrence of the application of the correction signals assume that the first reference point of shaft 101 is rotated through an angle of 180° from the assumed initial position in which it was in the first angular position. It is understood therefore, that 2,048 pulses have been applied along line 4XUD to the input of counter CN3. As a result of counting each of those 2,048 pulses counter CN3 produces signals on lines 3P0–3P11 representing in binary form the equivalent of the decimal number 2,048.

If for some reason the signals on lines 3P0–3P11 representing the number of pulses received by counter CN3 are in error, these signals will be corrected when the reference position of shaft 101 is 180° from its first angular position in the following manner.

Whenever shaft 101 is rotated 180° in a clockwise direction from its first angular position the pulse corresponding thereto is applied along line 4XUD to the input of counter CN3 almost simultaneously with the signal on line IM3 from pulse generator PG3, as previously explained, being transferred from the binary zero to the binary one level. As a result differential amplifier B3 (FIG. 8A) applies a zero level signal to the data line IM3B of register DIC2. The binary one signal along line 4XU at this time applied to exclusive OR gate XOR4 causes register DIC2 to transfer the zero level signal on line IM3B to its output line IM3B1. As will be understood from prior description, a binary one signal will be present on line IM3B2 at this time as a result of the continued presence of a binary one signal on line IM3B during the 180° rotation of shaft 101. The binary one level signal on line IM3B2 and the binary zero level signal on IM3B1 cause exclusive OR gate XOR1 to generate a signal which is applied along line IM3BSTB to counter CN3 to cause the ground or binary zero signal on lines 3Q0–3Q10 to be applied to lines 3P0–3P10. At this time the binary one signal on line IM3B2 is also applied to exclusive OR gate XOR5 which together with gate XOR6 generates a binary one signal along line 3Q11 to counter CN3. This binary one signal along line 3Q11 together with the binary zero signals along lines 3Q0–3Q10 are caused to be transferred to the output lines of counter CN3 by the signal applied to CN3 along line IM3BSTB so that if corresponding signals are not already existing on those output lines they will thereupon appear therealong. As a result the counter correctly represents in binary form the number of pulses applied to its input along line 4XUD during the 180° rotation. Counter CN3 is enabled to continue counting by the next pulse along line 4XU which transfers the binary one on line IM3B2 to a binary zero signal which causes a binary zero to appear along line IM3BSTB. This latter signal restores counter CN3 to a condition in which it can count pulses received along line 4XUD.

Similarly each time the first reference point of shaft 101 returns to the first angular position counter CN3 is also corrected to indicate the initial zero count. Under the circumstances, the signal on line IM3 changes from a binary one to a binary zero. This is clocked into register DIC2 in response to the simultaneous entrance of a pulse along line 4XU and causes the production of a binary one on line IM3B1 and IM3BSTB. The signal on this latter line enables the transfer of the ground or binary zero signal on lines 3Q0–3Q10 to appear on lines 3P0–3P10. A binary zero also appears on line 3Q11 in response to both line IM3B2 and line D10 having binary zero signals along these at this time. Consequently all lines 3P0–3P11 carry binary zero signals indicating the initial zero count.

Counter CN4 is arranged to have its count corrected if necessary each time the second reference point of shaft 106 is in the second angular position and 180° away from that position. The first of these corrective measures is similar to that provided on the embodiment of FIGS. 5 and 6. However in order to provide the correction for the 180° position additional equipment is included whose operation will be explained with regard to both corrective steps.

Whenever the second reference point of shaft 106 is in the second angular position the signal along line IM4 is transferred from a binary one to a binary zero. This causes the production of a binary one along line IM4B1 as a result of the simultaneous pulse along line 4XU. This binary one signal on line IM4B1 causes the production of a similar binary one signal along line IM4BSTB. As previously mentioned this causes the signals on lines 4P4–4P11 to appear on lines 3P12–3P19 of counter CN4, so that the former signals will appear thereon if similar such signals do not already. From the description of the arrangement of FIGS. 5 and 6 it will be evident that when the second reference point of shaft 106 is in the second angular position the count in counter CN3 represented by output lines 3P4–3P11 is indicative of the number of times the first reference point of shaft 101 has passed the first angular position. This number is the correct number for the output of counter CN4 during each particular revolution of shaft 101 and is transmitted to counter CN4 in response to the binary one signal along line IM4BSTB if it is not already producing that number. This occurs because adder ADD1 receives a binary zero signal from NOR gate NOG4 and exclusive OR gate XOR8 receives a binary zero signal along line BE. Consequently, the signals along lines 3P4–3P11 are simply transferred to lines 4P4–4P11 for further transfer by counter CN4 to lines 3P12–3P19. The signal along line BE is a binary zero when the second reference point of shaft 106 is in the second angular position because the signals along lines IM4B2 and line D10 are zero at that time for the assumed direction of rotation. With signals on lines 3P4–3P11 transferred to lines 3P12–3P19 the count is corrected.

The next pulse along line 4XU causes the production of a binary one along line IM4B2 and the transfer of the signal along line IM4BSTB to a binary zero. Consequently, the count on counter CN4 is retained until the receipt of the next carry signal along line CO30 as a result of counter CN3 completing a count of 4,096 pulses or until the receipt of the next corrective pulse along line IM4BSTB.

To understand how counter CN4 is corrected each time the second reference point of shaft 106 passes through an angular position 180° away from the second angular position, assume the rotation of shaft 101 has caused shaft 106 to be in this position. When this occurs, the signal generated by pulse generator PG4 and applied along line IM4 to amplifier B4 is changed from a binary zero to a binary one. As a result the next simultaneous pulse along line 4XU applied to register DIC2 (FIG. 8A) causes it to apply the binary zero signal from amplifier B4 on line IM4B to its output line IM4B1. As will be understood from previous discussion the presence of a binary one signal on line IM4B until this time has caused a binary one signal to be applied on line IM4B2. The binary zero signal on line IM4B1 is applied to one input of exclusive OR gate XOR2 where it is combined with the binary one signal applied along line IM4B2 to the second input of that gate to produce a pulse signal which is applied along line IM4BSTB to counter CN4.

It is to be understood that whenever the second reference point of shaft 106 is 180° away from the second angular position the count in counter CN3 indicated by the signals along line 3P4–3P11 is representative of the number of times the first reference point of shaft 101 has passed through the first angular position from the initial assumed condition plus a number indicative of the angle shaft 101 has rotated equivalent to the 180° shaft 106 has rotated since its second reference point was last in the second angular position. This equivalent angle causes the signal on line 3P11 to be the complement of the number desired to be transferred to counter CN4 when the second reference point of shaft 106 is 180° from the second angular position. Exclusive OR gate XOR8 compensates for this by causing the signal on line 4P11 to be a binary one when the signal on line 3P11 is a binary zero and vice versa. This is accomplished because the signal along line BE is a binary one when the second reference point of shaft 106 is 180° away from the second angular position as a result of the continued presence of the binary one signal along line IM4B2 during rotation of the second reference point of shaft 106 from the second angular position to the position 180° removed therefrom for the assumed direction of rotation.

With a binary one along line BE, a binary one on line 3P11 and consequently 4P11A exclusive OR gate XOR8 produces a binary zero on line 4P11. Conversely, a binary zero on line 3P11 and 4P11A enables gate XOR8 to produce a binary one signal on line 4P11. As a result during the production of the signal along line IM4BSTB the number transferred to counter CN4 is not rendered incorrect by the presence of the complement on line 3P11 of the proper signal to be transferred to line 4P11.

From what has been explained it should be understood that the signal generated by pulse generator PG4 and applied along line IM4 to signal conditioner COND2 increasingly lags the signal generated by pulse generator PG3 and applied along line IM3 to signal conditioner COND2 with further rotation of shaft 101. As a result of this increasing lag when the reference point of shaft 101 has been angularly displaced from its initial position by 128½ turns the logic level of the signals applied along lines IM3 changes from a binary zero signal to a binary one signal and simultaneously the signal applied along line IM4 changes from a binary one to a binary zero. As will be explained, when the first reference point of shaft 101 is rotated in excess of 129 rotations through its initial angular position the signals on data lines 4P4–4P11 when applied to counter CN4 as described would incorrectly represent the number of rotations of the first reference point. Consequently full adder ADD1, gates XOR7, XOR8 and inverter IA5 act as a signal translator to provide that the signals on line 4P4–4P11 correctly represent the number of rotations of the first reference point of shaft 101 whenever those signals are to be applied to the output lines 3P12–3P19 of counter CN4.

Because of the increasing lag between shaft 101 and shaft 106 the first reference point of shaft 101 moves closer and closer to the first angular position for each additional positioning of the second reference point of shaft 106 at the position 180° from the second angular position. Nevertheless, the signals applied from counter CN3 along lines 3P4–3P10 and that applied to line 4P11A by OR gate XOR8 when the second reference point of shaft 106 is in the 180° position correctly signifies the number of revolutions of the first reference point of shaft 101 past the first angular position. This continues until the 127th revolution of shaft 101 when its first reference point is ½ a tooth from the first angular position and the second reference point of shaft 106 is 180° from the second angular position. During the next revolution of shaft 106 through 257 teeth of gear 104, the first reference point of shaft 101 therefore will pass through the first angular position twice because its gear 102 with its 256 teeth has to rotate through 257 teeth also. This brings the first reference point ½ a tooth past the first angular position. Accordingly, when the second reference point of shaft 106 arrives at the position 180° from the second angular position as a result of this rotation the count in counter CN3 representing the number of times the first reference point has passed the first angular position should be equivalent to two more than was in it on the next preceding arrival of the second reference point of shaft 106 at the position 180° away from the second angular position. The count in counter CN3, however, appears to indicate that only one such revolution of shaft 101 past the first angular position has occurred. In order to provide for the additional count NOR gate NOG4 applies a binary one to adder ADD1 during this and each subsequent arrival of the second reference point of shaft 106 at its 180° position.

At each such arrival the signal along line IM4B2 is a binary one, producing a binary zero signal on line $\overline{BE}$. Also because of this position of the first reference point of shaft 101 with respect to the first angular position during this and each subsequent arrival of the second reference point of shaft 106 at the 180° position the signal along line 3P11 at each such time is also a binary zero. This produces a binary one signal along line CO40 which added to the signals along lines 3P4–3P10 and together with the signal along line 4P11 transfers to lines 3P12–3P19 during such revolutions signals signifying the number of times the first reference point has passed the first angular position to correct the output of counter CN4 should it be in error at such times.

From the foregoing it can be seen that should counters CN3 or CN4 fail to represent correctly the signals signifying the position of the first reference point of shaft 101 and the number of times the first reference point of shaft 101 has passed through its first angular position, the output signals from those counters CN3 and CN4 will be corrected each time the logic level of the signals generated by signal generators PG3 and PG4 is changed from a first level to a second level or from the second level to a first level. The level changes which cause the correction of counter CN3 during each revolution of shaft 101 have been chosen to occur when the first reference point of shaft 101 is at its first angular position and again when the first reference point is angularly displaced from its first angular position by 180°. The level changes which cause the correction of counter CN4 during each revolution of shaft 101 have been chosen to occur when the second reference point of shaft 106 is at its second angular position and again when that second reference point is displaced from its second angular position by 180°.

Operation of this embodiment in response to rotation of shafts 101 and 106 such that the counters reduce the numbers stored therein in response to the signals applied along line 4XUD occurs in the absence of a signal on line U10. This absence occurs as a result of the signals on line X3 leading the signals on line Y3. This operation will be apparent to those of ordinary skill in the art in view of the foregoing and will not be explained herein for purpose of brevity. It should be mentioned, however, that because of the reversal of rotation of the shafts the signals along line IM3B2 and IM4B2 are in the wrong state to produce the functions desired of exclusive OR gate XOR8 and NOR gate NOG4 as previously described. To resolve this input signals are applied along line D10 to exclusive OR gates XOR5 and XOR7 which signals provide the operation provided by the signals along lines IM3B2 and IM4B2 for the opposite direction of rotation.

It is apparent that various modifications of the above will be evident to those skilled in the art and that the arrangement described herein is for illustrative purposes and is not to be considered restrictive.

What is claimed is:

1. A rotary shaft position transducer for providing a binary representation of the number of revolutions made by a rotatable shaft to which the transducer is connected, comprising:

first and second coded disks having sensible indicia thereon and arranged for mutually related rotation by said shaft so that a first one of said coded disks is rotated an integral number of revolutions for each revolution of said shaft and the second one of said coded disks is rotated an even binary number of, or $2^n$, revolutions as said first coded disk is rotated one more than said binary number, or $2^n+1$ revolutions, where n is an integer greater than zero;

sensing means related to each disk for sensing the incidia thereon to provide signals indicative of rotation of each disk from a rotational reference position; and signal processing means interconnected with said sensing means and responsive to the signals corresponding to said first coded disk for providing a binary signal representation of the angular position of said first coded disk, and responsive to the signals corresponding to both of said coded disks to provide, as a function of the difference in the angular positions of said disks indicated thereby, a binary signal representation of the number of revolutions that said first coded disk is rotated from said rotational reference position.

2. A rotary shift position transducer according to claim 1 wherein:

each of said coded disks has a plurality of coded tracks and corresponding sensing means for providing distinctly different and unique digital code signals resolving each revolution of the corresponding one of said coded disks into a second binary number, or $2^m$, of unique angular positions with respect to a reference position, where m is of the same order of magnitude as n; and said processing means comprises:

first means responsive to the code signals provided by the sensing means corresponding to a first one of said coded disks to provide said binary signal representation of the angular position of said first coded disk;

second means for developing minuend signals from the code signals corresponding to said first coded disk, related to the angular position of said first coded disk;

third means for developing subtrahend signals from the code signals corresponding to a second one of said coded disks, related to the angular position of said second coded disk; and means including a subtractor responsive to said second and third means for providing remainder signals related to the difference in the angular positions indicated by said minuend signals and said subtrahend signals, said remainder signals comprising said binary signal representation of the number of revolutions that said first coded disk is rotated from said rotational reference position.

3. A shaft position transducer according to claim 1, wherein:

said first coded disk has a first coded track with a second binary number of, or $2^m$ sensible indicia thereon, where m is of the same order of magnitude as n and has one or more first reference sensible indicia thereon;

said second coded disk has one or more second reference sensible indicia thereon;

said sensing means includes first means for sensing said first reference indicia as a consequence of rotational movement of said first coded disk and providing first signals in response thereto, second means for sensing said second sensible indicia as a consequence of rotational movement of said second coded disk and providing second signals in response thereto, and third means for sensing the indicia of said first coded track as a consequence of rotational movement of said first coded disk and providing third signals in response thereto; and said processing means comprises:

a first binary counter, having a plurality of parallel data inputs and a parallel entry command input, connected to said third means for counting said third signals and providing at its outputs said binary signal representation of the angular position of said first coded disk and providing a carry signal in response to each counting of a number of said third signals indicative of a full revolution of said first coded disk;

a second binary counter, having a plurality of parallel data inputs and a parallel data entry command input, connected to said first counter for counting the carry signals from said first counter;

said parallel entry command input of said first counter connected to said first means and responsive to said first signals to enter therein through said parallel data inputs, in response to said first signals, a count indicative of the rotational position of said first coded disk being k half-revolutions, where $k=0$ or an integer;

said parallel data entry command input of said second counter being connected to said second means; and said parallel data inputs of said second counter interconnected with outputs of said first counter for entering into said second counter, in response to said second signals, a count indicative of the rotary position of said first coded disk, said second counter providing at its outputs said binary signal representation of the number of revolutions that said first coded disk is rotated from said rotational reference position;

whereby said first counter outputs provide both a binary indication of the angular position of said first coded disk and a sub-revolution indication of the relative rotation between said first and second coded disks.

4. A shaft position transducer according to claim 3 wherein $k=1$ and:

said first coded disk has reference sensible indicia thereon indicative of a said rotational reference position and of a reference position 180° from said rotational reference position, said first signals thereby delineating half-revolutions of said first coded disk;

said second coded disk has reference sensible indicia thereon indicative of said rotational reference position and of a reference position 180° from said rotational reference position, said second signals thereby delineating half-revolutions of said second coded disk; and further comprising:

means responsive to said first, second and third signals for providing control signals indicative of the direction of rotation and relative position of said coded disks, for providing an input to the highest-ordered parallel data input of said first counter in response to said control signals and zeros to the remaining parallel data inputs of said first counter, and for selectively (1) adding to the count represented by the outputs of said first counter and/or (2) reversing the binary significance of the highest-ordered output of said first counter, as applied to the parallel data inputs of said second counter in response to said control signals, whereby said counters are volatility-corrected within a single revolution of said first coded disk.

5. A shaft position encoder according to claim 3 wherein $k=0$ and:

said parallel data inputs of said first counter are disposed to enter a count of zero in response to said first signal, and said parallel data inputs of said second counter are all directly responsive to corresponding high order outputs of said first counter, whereby said counters are volatility-corrected within two revolutions of said first coded disk.

* * * * *